United States Patent
Fukuda

(10) Patent No.: US 10,637,433 B2
(45) Date of Patent: Apr. 28, 2020

(54) ELASTIC WAVE DEVICE, RADIO-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventor: Yuji Fukuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/375,870

(22) Filed: Apr. 5, 2019

(65) Prior Publication Data

US 2019/0238112 A1    Aug. 1, 2019

Related U.S. Application Data

(63) Continuation of application No. PCT/JP2017/028480, filed on Aug. 4, 2017.

(30) Foreign Application Priority Data

Oct. 28, 2016  (JP) .................................. 2016-211931

(51) Int. Cl.
*H03H 9/02* (2006.01)
*H04B 1/40* (2015.01)
(Continued)

(52) U.S. Cl.
CPC ........... *H03H 9/02834* (2013.01); *H03F 3/24* (2013.01); *H03H 9/059* (2013.01);
(Continued)

(58) Field of Classification Search
CPC ............. H03H 9/02834; H03H 9/0542; H03H 9/0576; H03H 9/059; H03H 9/1064;
(Continued)

(56) References Cited

U.S. PATENT DOCUMENTS

2002/0000895 A1    1/2002   Takahashi et al.
2010/0289600 A1*  11/2010   Takada .................. H03H 9/0523
                                                        333/193

(Continued)

FOREIGN PATENT DOCUMENTS

JP      07-249657 A    9/1995
JP      11-26623 A     1/1999
(Continued)

OTHER PUBLICATIONS

Official Communication issued in International Patent Application No. PCT/JP2017/028480, dated Oct. 24, 2017.

*Primary Examiner* — Lee Nguyen
(74) *Attorney, Agent, or Firm* — Keating & Bennett, LLP

(57) ABSTRACT

An elastic wave device includes a mount board, a transmit filter, a receive filter, and a sealing resin layer. The transmit filter includes a first piezoelectric substrate, and is joined to the mount board by first bumps. The receive filter includes a second piezoelectric substrate, and is joined to the mount board by second bumps. The sealing resin layer is provided on the mount board. The height of each first bump is H1; the joint area, on the first piezoelectric substrate side, of each first bump is A1; and the joint area, on the mount board side, of each first bump is B1; the height of each second bump is H2; the joint area, on the second piezoelectric substrate side, of each second bump is A2; and the joint area, on the mount board side, of each second bump is B2. The first bumps and the second bumps satisfy at least one of: A1>A2 and B1>B2; and H1<H2.

21 Claims, 2 Drawing Sheets

(51) Int. Cl.
- *H03H 9/05* (2006.01)
- *H03H 9/10* (2006.01)
- *H03H 9/25* (2006.01)
- *H03H 9/64* (2006.01)
- *H03H 9/72* (2006.01)
- *H03H 9/145* (2006.01)
- *H03F 3/24* (2006.01)
- *H03F 3/20* (2006.01)

(52) U.S. Cl.
CPC ........ *H03H 9/0542* (2013.01); *H03H 9/0576* (2013.01); *H03H 9/1064* (2013.01); *H03H 9/1085* (2013.01); *H03H 9/145* (2013.01); *H03H 9/25* (2013.01); *H03H 9/6489* (2013.01); *H03H 9/72* (2013.01); *H03H 9/725* (2013.01); *H04B 1/40* (2013.01); *H03F 3/20* (2013.01); *H03F 2200/451* (2013.01)

(58) Field of Classification Search
CPC ........ H03H 9/145; H03H 9/25; H03H 9/6489; H03H 9/725; H04B 1/40; H03F 3/20; H03F 2200/451
USPC ............................................ 455/73; 333/193
See application file for complete search history.

(56) References Cited

U.S. PATENT DOCUMENTS

2014/0368296 A1    12/2014   Nishizawa
2015/0028966 A1     1/2015   Iwamoto

FOREIGN PATENT DOCUMENTS

| | | |
|---|---|---|
| JP | 2015-002511 A | 1/2015 |
| JP | 2015-023474 A | 2/2015 |
| WO | 2013/141184 A1 | 9/2013 |

* cited by examiner

ELASTIC WAVE DEVICE, RADIO-FREQUENCY FRONT-END CIRCUIT, AND COMMUNICATION DEVICE

This application claims the benefit of priority to Japanese Patent Application No. 2016-211931 filed on Oct. 28, 2016 and is a Continuation Application of PCT Application No. PCT/JP2017/028480 filed on Aug. 4, 2017. The entire contents of each application are hereby incorporated herein by reference.

BACKGROUND OF THE INVENTION

1. Field of the Invention

The present invention relates to an elastic wave device, a radio-frequency front-end circuit, and a communication device.

2. Description of the Related Art

Heretofore, elastic wave devices have been being used widely, for example, in filters of cellular phones. International Publication No. 2013/141184 described below discloses an exemplary elastic wave device. In the elastic wave device described in International Publication No. 2013/141184, a transmit filter and a receive filter are mounted on the mount board. An insulating material is disposed on the mount board so as to cover the transmit filter and the receive filter. In the transmit filter, a piezoelectric material layer is disposed on the support substrate, and an interdigital transducer (IDT) electrode is disposed on the piezoelectric material layer. The thermal conductivity of the support substrate is higher than the thermal conductivity of the piezoelectric material layer.

SUMMARY OF THE INVENTION

In an elastic wave device, when a receive filter is compared with a transmit filter, the transmit filter generates a larger amount of heat. In the elastic wave device described in International Publication No. 2013/141184, heat may propagate from the piezoelectric material layer and the support substrate of the transmit filter to the receive filter via the insulating material. Therefore, the receive filter may be heated to a high temperature, causing troubles to occur in the receive filter.

Preferred embodiments of the present invention provide elastic wave devices, radio-frequency front-end circuits, and communication devices, each of which improve dissipation of heat generated due to heating of a transmit filter, thus reducing or preventing propagation of heat from the transmit filter to a receive filter.

An elastic wave device according to a preferred embodiment of the present invention includes a mount board, a transmit filter, a receive filter, and a sealing resin layer. The transmit filter includes a first piezoelectric substrate, a first IDT electrode disposed on the first piezoelectric substrate, and a first bump, and is joined to the mount board by using the first bump. The receive filter includes a second piezoelectric substrate, a second IDT electrode disposed on the second piezoelectric substrate, and a second bump, and is joined to the mount board by using the second bump. The sealing resin layer is disposed on the mount board so as to cover the transmit filter and the receive filter. The first piezoelectric substrate includes a first principal surface and a second principal surface. The first principal surface is a principal surface on the mount board side. The second principal surface faces the first principal surface. The second piezoelectric substrate includes a first principal surface and a second principal surface. The first principal surface is a principal surface on the mount board side. The second principal surface faces the first principal surface. The first bump and the second bump satisfy at least one of a first relation A1>A2 and B1>B2, and a second relation H1<H2. A direction connecting the mount board to the first piezoelectric substrate is a height direction, a height of the first bump is H1, a joint area, on the first piezoelectric substrate side, of the first bump is A1, a joint area, on the mount board side, of the first bump is B1, a height of the second bump is H2, a joint area, on the second piezoelectric substrate side, of the second bump is A2, and a joint area, on the mount board side, of the second bump is B2.

According to a certain specific aspect of an elastic wave device according to a preferred embodiment of the present invention, the first bump and the second bump have both the relations. The first one of the relations is A1>A2 and B1>B2. The second one of the relations is H1<H2. In this case, heat dissipation is improved more greatly.

According to another certain specific aspect of an elastic wave device according to a preferred embodiment of the present invention, the first IDT electrode is disposed on the first principal surface of the first piezoelectric substrate. In this case, heat dissipation is improved more greatly.

According to another certain specific aspect of an elastic wave device according to a preferred embodiment of the present invention, at least one of the following configurations is used: a configuration in which a position, in the height direction, of the first principal surface of the first piezoelectric substrate is different from a position, in the height direction, of the first principal surface of the second piezoelectric substrate; and a configuration in which a position, in the height direction, of the second principal surface of the first piezoelectric substrate is different from a position, in the height direction, of the second principal surface of the second piezoelectric substrate. In this case, it is difficult for heat to propagate from the first piezoelectric substrate to the second piezoelectric substrate via the sealing resin layer. Therefore, problems are prevented from occurring in the receive filter.

According to another certain specific aspect of an elastic wave device according to a preferred embodiment of the present invention, an arrangement of the first IDT electrode and the second IDT electrode on the first piezoelectric substrate and the second piezoelectric substrate is one of following arrangements: an arrangement in which the first IDT electrode is positioned on the first principal surface of the first piezoelectric substrate and in which the second IDT electrode is positioned on the first principal surface of the second piezoelectric substrate; and an arrangement in which the first IDT electrode is positioned on the second principal surface of the first piezoelectric substrate and in which the second IDT electrode is positioned on the second principal surface of the second piezoelectric substrate. A position, in the height direction, of a principal surface of the first piezoelectric substrate is different from a position, in the height direction, of a principal surface of the second piezoelectric substrate. The principal surface of the first piezoelectric substrate is one of the first principal surface and the second principal surface of the first piezoelectric substrate and is a principal surface on which the first IDT electrode is positioned. The principal surface of the second piezoelectric substrate is one of the first principal surface and the second principal surface of the second piezoelectric substrate and is a principal surface on which the second IDT electrode is positioned. In this case, it is difficult for heat to propagate from the first IDT electrode to the second IDT electrode via the sealing resin layer. Therefore, problems are prevented from occurring in the receive filter.

According to another certain specific aspect of an elastic wave device according to a preferred embodiment of the present invention, the position, in the height direction, of the first principal surface of the first piezoelectric substrate is closer to the mount board than the position, in the height direction, of the first principal surface of the second piezoelectric substrate. In this case, it is difficult for heat to propagate from the first IDT electrode to the second IDT electrode via the sealing resin layer. Therefore, problems are prevented from occurring in the receive filter.

A radio-frequency front-end circuit according to another preferred embodiment of the present invention includes an elastic wave device according to one of the above-described preferred embodiments of the present invention, and a power amplifier.

A communication device according to an additional preferred embodiment of the present invention includes the radio-frequency front-end circuit according to the above-described preferred embodiment of the present invention, and an RF signal processing circuit.

Preferred embodiments of the present invention may provide elastic wave devices, radio-frequency front-end circuits, and communication devices, each of which improve dissipation of heat generated due to heating of a transmit filter, thus achieving suppression or prevention of propagation of heat from the transmit filter to a receive filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
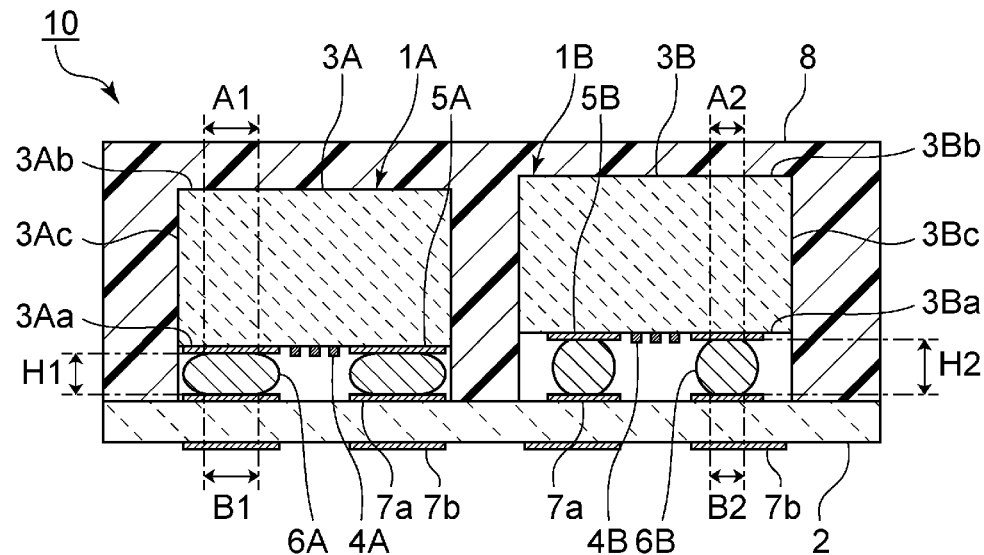
FIG. 1 is a front sectional view of an elastic wave device according to a first preferred embodiment of the present invention.

Referring to the drawings, specific preferred embodiments of the present invention will be described for disclosure of the present invention.

It is to be noted that the preferred embodiments described herein are examples and a subset of the components may be replaced or combined between different preferred embodiments.

FIG. 1 is a front sectional view of an elastic wave device according to a first preferred embodiment of the present invention.

An elastic wave device 10 includes a mount board 2. The mount board 2 is formed, for example, of glass epoxy resin or appropriate ceramics, which is not particularly limiting.

A transmit filter 1A and a receive filter 1B are mounted on the mount board 2. The transmit filter 1A includes a first piezoelectric substrate 3A. The first piezoelectric substrate 3A includes a first principal surface 3Aa, which is a surface on the mount board 2 side, and a second principal surface 3Ab facing the first principal surface 3Aa. The first piezoelectric substrate 3A includes a side surface 3Ac which connects the first principal surface 3Aa to the second principal surface 3Ab. The first piezoelectric substrate 3A is formed, for example, of a piezoelectric single crystal, such as $LiTaO_3$ or $LiNbO_3$, or appropriate piezoelectric ceramics, which is not particularly limiting.

A first interdigital transducer (IDT) electrode 4A is disposed on the first principal surface 3Aa of the first piezoelectric substrate 3A. First electrode pads 5A, to which the first IDT electrode 4A is electrically coupled, are disposed on the first principal surface 3Aa. First bumps 6A are disposed on the first electrode pads 5A. The first bumps 6A are formed, for example, of solder.

The transmit filter 1A is joined to the mount board 2 by using the first bumps 6A. More specifically, multiple terminals 7a are disposed on the principal surface, which is disposed closer to the transmit filter 1A and the receive filter 1B, of the mount board 2. The first electrode pads 5A are joined to terminals 7a by using the first bumps 6A. Multiple terminals 7b are disposed on the principal surface facing the above-described principal surface of the mount board 2. The first IDT electrode 4A of the transmit filter 1A is coupled electrically to the outside via the first electrode pads 5A, the first bumps 6A, and terminals 7a and 7b.

In contrast, the receive filter 1B includes a second piezoelectric substrate 3B. The second piezoelectric substrate 3B includes a first principal surface 3Ba, which is a surface on the mount board 2 side, and a second principal surface 3Bb facing the first principal surface 3Ba. The second piezoelectric substrate 3B includes a side surface 3Bc which connects the first principal surface 3Ba to the second principal surface 3Bb. The second piezoelectric substrate 3B is formed, for example, of a piezoelectric single crystal, such as $LiTaO_3$ or $LiNbO_3$, or appropriate piezoelectric ceramics, which is not particularly limiting.

A second IDT electrode 4B is disposed on the first principal surface 3Ba of the second piezoelectric substrate 3B. Second electrode pads 5B, to which the second IDT electrode 4B is electrically coupled, are disposed on the first principal surface 3Ba. Second bumps 6B are disposed on the second electrode pads 5B. The second bumps 6B are formed, for example, of solder.

The receive filter 1B is joined to the mount board 2 by using the second bumps 6B. More specifically, the second electrode pads 5B are joined to terminals 7a by using the second bumps 6B. The second IDT electrode 4B of the receive filter 1B is coupled electrically to the outside via the second electrode pads 5B, the second bumps 6B, and terminals 7a and 7b.

A sealing resin layer 8 is disposed on the mount board 2 so as to cover the transmit filter 1A and the receive filter 1B.

It is assumed that the direction connecting the mount board 2 to the first piezoelectric substrate 3A is regarded as the height direction. It is assumed that the height of each first bump 6A is H1; the joint area, on the first piezoelectric substrate 3A side, of each first bump 6A is A1; and the joint area, on the mount board 2 side, of each first bump 6A is B1. It is assumed that the height of each second bump 6B is H2; the joint area, on the second piezoelectric substrate 3B side, of each second bump 6B is A2; and the joint area, on the mount board 2 side, of each second bump 6B is B2. At that time, in the present preferred embodiment, the first bumps 6A and the second bumps 6B preferably have both of the following relations: A1>A2 and B1>B2; and H1<H2. Any configuration may be used as long as the first bumps 6A and the second bumps 6B have at least one of the following relations: A1>A2 and B1>B2; and H1<H2.

In the elastic wave device 10, the position, in the height direction, of the first principal surface 3Aa of the first piezoelectric substrate 3A is different from the position, in the height direction, of the first principal surface 3Ba of the second piezoelectric substrate 3B. More specifically, the position, in the height direction, of the first principal surface 3Aa of the first piezoelectric substrate 3A is closer to the mount board 2 than the position, in the height direction, of the first principal surface 3Ba of the second piezoelectric substrate 3B.

The position, in the height direction, of the second principal surface 3Ab of the first piezoelectric substrate 3A is also different from the position, in the height direction, of the second principal surface 3Bb of the second piezoelectric substrate 3B. More specifically, the position, in the height direction, of the second principal surface 3Ab of the first piezoelectric substrate 3A is closer to the mount board 2 than the position, in the height direction, of the second principal surface 3Bb of the second piezoelectric substrate 3B.

One of the unique characteristics of a preferred embodiment of the present invention is that the first bumps 6A and the second bumps 6B preferably satisfy at least one of the following relations: A1>A2 and B1>B2; and H1<H2. This improves dissipation of heat generated due to heating of the transmit filter 1A, achieving suppression or prevention of propagation of heat from the transmit filter 1A to the receive filter 1B. This will be described below.

Typically, when a transmit filter is compared with a receive filter, a transmit filter generates a larger amount of heat. In the present preferred embodiment, the first bumps 6A and the second bumps 6B have the relation of A1>A2 and B1>B2. Thus, since the joint area, on the first piezoelectric substrate 3A side, of the first bumps 6A is large, heat propagates rapidly from the first piezoelectric substrate 3A to the first bumps 6A. Further, since the joint area, on the mount board 2 side, of the first bumps 6A is also large, heat generated due to heating of the transmit filter 1A propagates rapidly to the mount board 2. Wiring (not illustrated) connecting the terminals 7a to the terminals 7b is disposed in the mount board 2. Heat is dissipated to the outside of the elastic wave device 10 via the terminals 7a, the wiring, and the terminals 7b. Thus, heat may be dissipated effectively from the transmit filter 1A via the mount board 2, resulting in suppression or prevention of propagation of heat from the transmit filter 1A to the sealing resin layer 8. Therefore, propagation of heat from the transmit filter 1A to the receive filter 1B via the sealing resin layer 8 is reduced or prevented.

In the present preferred embodiment, the first bumps 6A and the second bumps 6B also have the relation of H1<H2. This shortens the heat dissipation path from the transmit filter 1A to the mount board 2. This causes heat generated due to heating of the transmit filter 1A to propagate more rapidly through the mount board 2. Therefore, heat dissipation of the elastic wave device 10 via the mount board 2 may be more greatly improved. Therefore, propagation of heat from the transmit filter 1A to the receive filter 1B via the sealing resin layer 8 may be reduced to a large extent or even prevented.

As described above, heat dissipation of the transmit filter 1A is improved, thus reducing or preventing problems in the transmit filter 1A. Further, since it is difficult for heat to propagate to the receive filter 1B, problems in the receive filter 1B are also reduced or prevented.

As in the present preferred embodiment, the first bumps 6A and the second bumps 6B preferably have both of the following relations: A1>A2 and B1>B2; and H1<H2, for example. However, any configuration may be used as long as the first bumps 6A and the second bumps 6B have at least one of the following relations: A1>A2 and B1>B2; and H1<H2. As described above, when the first bumps 6A and the second bumps 6B have the relation of A1>A2 and B1>B2, the joint area, on the first piezoelectric substrate 3A side, of the first bumps 6A and the joint area, on the mount board 2 side, of the first bumps 6A are large. This causes heat to propagate rapidly from the first piezoelectric substrate 3A to the mount board 2 via the first bumps 6A. In contrast, when the first bumps 6A and the second bumps 6B also have the relation of H1<H2, the heat dissipation path from the transmit filter 1A to the mount board 2 is shortened. This causes heat generated due to heating of the transmit filter 1A to propagate rapidly to the mount board 2. Thus, heat dissipation of the transmit filter 1B through the mount board 2 is improved. Therefore, propagation of heat from the transmit filter 1A to the receive filter 1B is reduced or prevented.

As in the present preferred embodiment, the first IDT electrode 4A of the transmit filter 1A is preferably disposed on the first principal surface 3Aa of the first piezoelectric substrate 3A. In the transmit filter 1A, heat is generated mainly from the first IDT electrode 4A. Since the first IDT electrode 4A is disposed on the first principal surface 3Aa, the heat dissipation path through which heat propagates from the first IDT electrode 4A to the mount board 2 is shortened. This improves heat dissipation of the transmit filter 1A effectively.

Similarly, the second IDT electrode 4B of the receive filter 1B is preferably disposed on the first principal surface 3Ba of the second piezoelectric substrate 3B. In the receive filter 1B, heat is generated mainly from the second IDT electrode 4B. Since the second IDT electrode 4B is disposed on the first principal surface 3Ba, the heat dissipation path from the second IDT electrode 4B to the mount board 2 is shortened. This improves heat dissipation of the receive filter 1B effectively. A configuration in which the first IDT electrode 4A is disposed on the second principal surface 3Ab of the first piezoelectric substrate 3A and in which the second IDT electrode 4B is disposed on the second principal surface 3Bb of the second piezoelectric substrate 3B may be used.

At least one of the following arrangements is preferably used: the arrangement in which the position, in the height direction, of the first principal surface 3Aa of the first piezoelectric substrate 3A is different from the position, in the height direction, of the first principal surface 3Ba of the second piezoelectric substrate 3B; and the arrangement in which the position, in the height direction, of the second principal surface 3Ab of the first piezoelectric substrate 3A is different from the position, in the height direction, of the second principal surface 3Bb of the second piezoelectric substrate 3B. In this case, the elastic wave device 10 includes a portion in which the side surface 3Ac of the first piezoelectric substrate 3A does not face the side surface 3Bc of the second piezoelectric substrate 3B. In the portion in which the side surface 3Ac does not face the side surface 3Bc, the distance between the side surface 3Ac of the first piezoelectric substrate 3A and the side surface 3Bc of the second piezoelectric substrate 3B is made longer. This makes heat difficult to propagate from the first piezoelectric substrate 3A to the second piezoelectric substrate 3B via the sealing resin layer 8.

The position, in the height direction, of the first principal surface 3Ba of the second piezoelectric substrate 3B is more preferably different from the position, in the height direction, of the first principal surface 3Aa of the first piezoelectric substrate 3A. As described above, in the transmit filter 1A, heat is generated mainly from the first IDT electrode 4A. Since the distance between the first IDT electrode 4A and the second IDT electrode 4B may be made longer, it is difficult for heat to propagate from the first IDT electrode 4A to the second IDT electrode 4B via the sealing resin layer 8. Therefore, it is more difficult for problems to occur in the receive filter 1B. In the case where the first IDT electrode 4A and the second IDT electrode 4B are disposed on the second principal surface 3Ab and the second principal surface 3Bb, respectively, the position, in the height direction, of the second principal surface 3Ab is preferably different from the position, in the height direction, of the second principal surface 3Bb.

The position, in the height direction, of the first principal surface 3Aa of the first piezoelectric substrate 3A is more preferably closer to the mount board 2 than the position, in the height direction, of the first principal surface 3Ba of the second piezoelectric substrate 3B. In this case, the heat dissipation path through which heat propagates from the first IDT electrode 4A to the mount board 2 is more significantly shortened. Therefore, heat dissipation is more greatly improved. In addition, it is much more difficult for heat to propagate from the first IDT electrode 4A to the second IDT electrode 4B via the sealing resin layer 8. Therefore, problems in the receive filter 1B are reduced or prevented.

Any configuration may be used as long as the elastic wave device 10 includes at least one set of the transmit filter 1A and the receive filter 1B. Other transmit filters and receive filters may be mounted on the mount board 2.

Figure 2:
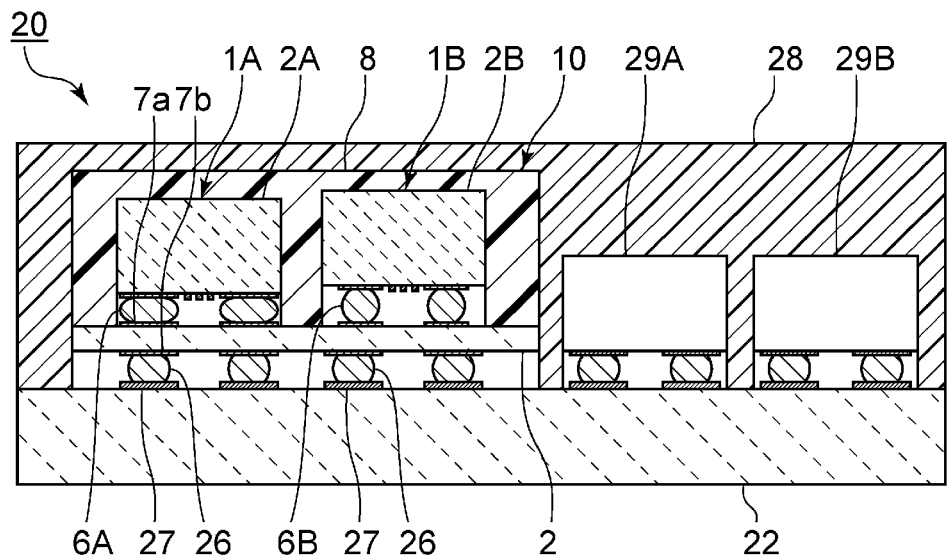
FIG. 2 is a front sectional view of an elastic-wave-device mounted structure according to a second preferred embodiment of the present invention.

FIG. 2 is a front sectional view of an elastic-wave-device mounted structure according to a second preferred embodiment of the present invention.

An elastic-wave-device mounted structure 20 includes a substrate 22. The substrate 22 is formed, for example, of glass epoxy resin or appropriate ceramics, which is not particularly limiting.

The elastic wave device 10 according to the first preferred embodiment is mounted on the substrate 22. More specifically, terminals 27 are disposed on the substrate 22. The terminals 7b of the elastic wave device 10 are joined to the terminals 27 on the substrate 22 by using conductive joining materials 26.

Devices 29A and 29B other than the elastic wave device 10 are mounted on the substrate 22. Thus, the elastic-wave-device mounted structure 20 may include devices other than the elastic wave device 10.

A sealing resin layer 28 is disposed on the substrate 22 so as to cover the elastic wave device 10 and the devices 29A and 29B.

Heat generated due to heating of the transmit filter 1A is dissipated to the substrate 22 via the first bumps 6A, terminals 7a and 7b, the conductive joining materials 26, and the terminals 27. In the elastic-wave-device mounted structure 20, since the mounted elastic wave device 10 has a configuration according to the first preferred embodiment, heat dissipation of the elastic wave device 10 is improved. In the elastic wave device 10, propagation of heat from the transmit filter 1A to the receive filter 1B is reduced or prevented.

The conductive joining materials 26 are preferably bumps. In this case, heat dissipation of the elastic wave device 10 may be suitably improved. The conductive joining materials 26 are not limited to bumps.

The elastic wave device described above may be used, for example, as a duplexer of a radio-frequency front-end circuit. This example will be described below.

Figure 3:
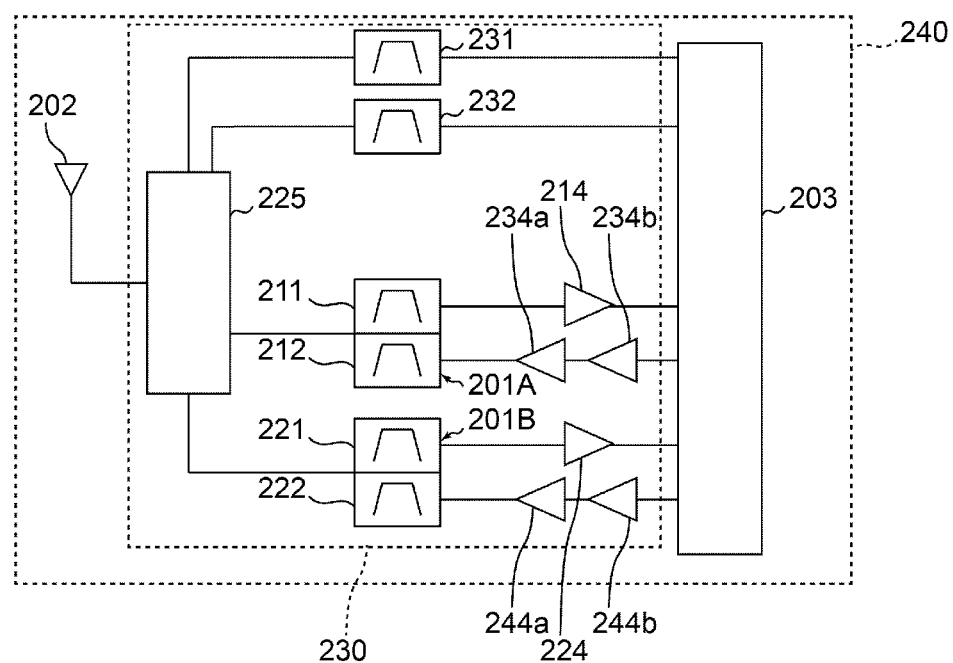
FIG. 3 is a diagram illustrating the configuration of a communication device and a radio-frequency front-end circuit according to a third preferred embodiment of the present invention.

FIG. 3 is a diagram illustrating the configuration of a communication device and a radio-frequency front-end circuit. FIG. 3 also illustrates components connected to a radio-frequency front-end circuit 230, for example, an antenna device 202 and a radio-frequency (RF) signal processing circuit (RFIC) 203. The radio-frequency front-end circuit 230 and the RF signal processing circuit 203 are included in a communication device 240. The communication device 240 may include a power supply, a central processing unit (CPU), and a display.

The radio-frequency front-end circuit 230 includes a switch 225, duplexers 201A and 201B, filters 231 and 232, low noise amplifier circuits 214 and 224, and power amplifier circuits 234a, 234b, 244a, and 244b. The radio-frequency front-end circuit 230 and the communication device 240 in FIG. 3 are an exemplary radio-frequency front-end circuit and an exemplary communication device, and are not limited to this configuration.

The duplexer 201A includes filters 211 and 212. The duplexer 201B includes filters 221 and 222. The duplexers 201A and 201B are connected to the antenna device 202 via the switch 225. The elastic wave device described above may be used as the duplexers 201A and 201B, or may be used as the filters 211, 212, 221, and 222.

The elastic wave devices described above may be also applied, for example, to a multiplexer having three or more filters, such as a triplexer including a common antenna terminal for three filters or a hexaplexer including a common antenna terminal for six filters.

That is, the elastic wave devices described above encompass elastic wave resonators, filters, duplexers, and multiplexers each including three or more filters. The multiplexer is not limited to the configuration in which both of a transmit filter and a receive filter are included, and may have a configuration in which only a transmit filter or only a receive filter is included.

The switch 225 connects the antenna device 202 to a signal path corresponding to a given band, in accordance with a control signal from a controller (not illustrated). The switch 225 includes, for example, of a single pole double throw (SPDT) switch. The number of signal paths connected to the antenna device 202 is not limited to one, and may be two or more. That is, the radio-frequency front-end circuit 230 may be compatible with carrier aggregation.

The low noise amplifier circuit 214 is a receive amplifier circuit that amplifies a radio-frequency signal (herein, a radio-frequency receive signal) transmitted via the antenna device 202, the switch 225, and the duplexer 201A and that outputs the resulting signal to the RF signal processing circuit 203. The low noise amplifier circuit 224 is a receive amplifier circuit that amplifies a radio-frequency signal (herein, a radio-frequency receive signal) transmitted via the antenna device 202, the switch 225, and the duplexer 201B and that outputs the resulting signal to the RF signal processing circuit 203.

The power amplifier circuits 234a and 234b are a transmit amplifier circuit that amplifies a radio-frequency signal (herein, a radio-frequency transmit signal) having been output from the RF signal processing circuit 203 and that outputs the resulting signal to the antenna device 202 via the duplexer 201A and the switch 225. The power amplifier circuits 244a and 244b are a transmit amplifier circuit that amplifies a radio-frequency signal (herein, a radio-frequency transmit signal) having been output from the RF signal processing circuit 203 and that outputs the resulting signal to the antenna device 202 via the duplexer 201B and the switch 225.

The RF signal processing circuit 203 performs signal processing, for example, through down-converting, on a radio-frequency receive signal received through a receive signal path from the antenna device 202, and outputs the receive signal generated through the signal processing. The RF signal processing circuit 203 performs signal processing, for example, through up-converting, on an input transmit signal, and outputs the radio-frequency transmit signal, which is generated through the signal processing, to the power amplifier circuit 234a, 234b, 244a, 244b. The RF signal processing circuit 203 is, for example, an RFIC. The communication device may include a base band (BB) IC. In this case, the BBIC performs signal processing on a receive signal having been processed by the RFIC. The BBIC performs signal processing on a transmit signal, and outputs the resulting signal to the RFIC. Receive signals having been processed by the BBIC and transmit signals that are to be subjected to signal processing by the BBIC are, for example, image signals and audio signals. The radio-frequency front-end circuit 230 may include other circuit devices between the components described above.

The radio-frequency front-end circuit 230 may include, instead of the duplexers 201A and 201B, duplexers according to a modified example of the duplexers 201A and 201B.

In contrast, the filters 231 and 232 in the communication device 240 are connected between the RF signal processing circuit 203 and the switch 225, not via the low noise amplifier circuits 214 and 224 and the power amplifier circuits 234a, 234b, 244a, and 244b. Similarly to the duplexers 201A and 201B, the filters 231 and 232 are also connected to the antenna device 202 via the switch 225.

The radio-frequency front-end circuit 230 and the communication device 240 having the configuration described above may improve dissipation of heat generated due to heating of the transmit filters in the duplexers 201A and 201B described above, achieving suppression or prevention of propagation of heat from the transmit filters to the receive filters.

As described above, the elastic wave devices, the radio-frequency front-end circuits, and the communication devices according to the preferred embodiments of the present invention are described through the preferred embodiments and their modified examples. The present invention encompasses different preferred embodiments implemented by combining any components in the preferred embodiments and modified examples with one another, modified examples obtained by making various changes, which are conceived by those skilled in the art without departing from the gist of the present invention, on the preferred embodiments described above, and various devices in which the radio-frequency front-end circuit and the communication device according to the present invention are incorporated.

Preferred embodiments of the present invention and modifications or combinations thereof may be widely used in communication equipment such as cellular phones, as elastic wave resonators, filters, duplexers, multiplexers applicable to multi-band systems, front-end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a mount board;
a transmit filter that includes a first piezoelectric substrate, a first interdigital transducer (IDT) electrode disposed on the first piezoelectric substrate, and a first bump, and that is joined to the mount board by the first bump;
a receive filter that includes a second piezoelectric substrate, a second IDT electrode disposed on the second piezoelectric substrate, and a second bump, and that is joined to the mount board by the second bump; and
a sealing resin layer that is disposed on the mount board so as to cover the transmit filter and the receive filter; wherein
the first piezoelectric substrate includes a first principal surface and a second principal surface, the first principal surface being a principal surface on a mount board side, the second principal surface facing the first principal surface;
the second piezoelectric substrate includes a first principal surface and a second principal surface, the first principal surface being a principal surface on the mount board side, the second principal surface facing the first principal surface; and
the first bump and the second bump satisfy at least one of:
A1>A2 and B1>B2; or
H1<H2;
where a direction connecting the mount board to the first piezoelectric substrate is a height direction, a height of the first bump is H1, a joint area, on the first piezoelectric substrate side, of the first bump is A1, a joint area, on the mount board side, of the first bump is B1, a height of the second bump is H2, a joint area, on the second piezoelectric substrate side, of the second bump is A2, and a joint area, on the mount board side, of the second bump is B2.

2. The elastic wave device according to claim 1, wherein the first bump and the second bump satisfy both of:
A1>A2 and B1>B2; and
H1<H2.

3. The elastic wave device according to claim 1, wherein the first IDT electrode is disposed on the first principal surface of the first piezoelectric substrate.

4. The elastic wave device according to claim 1, wherein a position, in the height direction, of the first principal surface of the first piezoelectric substrate is different from a position, in the height direction, of the first principal surface of the second piezoelectric substrate.

5. The elastic wave device according to claim 4, wherein the first IDT electrode is positioned on the first principal surface of the first piezoelectric substrate and the second IDT electrode is positioned on the first principal surface of the second piezoelectric substrate.

6. The elastic wave device according to claim 5, wherein a position, in the height direction, of a principal surface of the first piezoelectric substrate is different from a position, in the height direction, of a principal surface of the second piezoelectric substrate, the principal surface of the first piezoelectric substrate being one of the first principal surface and the second principal surface of the first piezoelectric substrate and being a principal surface on which the first IDT electrode is positioned, the principal surface of the second piezoelectric substrate being one of the first principal surface and the second principal surface of the second piezoelectric substrate and being a principal surface on which the second IDT electrode is positioned.

7. The elastic wave device according to claim 4, wherein the first IDT electrode is positioned on the second principal surface of the first piezoelectric substrate and the second IDT electrode is positioned on the second principal surface of the second piezoelectric substrate.

8. The elastic wave device according to claim 7, wherein a position, in the height direction, of a principal surface of the first piezoelectric substrate is different from a position, in the height direction, of a principal surface of the second piezoelectric substrate, the principal surface of the first piezoelectric substrate being one of the first principal surface and the second principal surface of the first piezoelectric substrate and being a principal surface on which the first IDT electrode is positioned, the principal surface of the second piezoelectric substrate being one of the first principal surface and the second principal surface of the second piezoelectric substrate and being a principal surface on which the second IDT electrode is positioned.

9. The elastic wave device according to claim 4, wherein the position, in the height direction, of the first principal surface of the first piezoelectric substrate is closer to the mount board than the position, in the height direction, of the first principal surface of the second piezoelectric substrate.

10. The elastic wave device according to claim 1, wherein a position, in the height direction, of the second principal surface of the first piezoelectric substrate is different from a position, in the height direction, of the second principal surface of the second piezoelectric substrate.

11. The elastic wave device according to claim 10, wherein the first IDT electrode is positioned on the first principal surface of the first piezoelectric substrate and the second IDT electrode is positioned on the first principal surface of the second piezoelectric substrate.

12. The elastic wave device according to claim 11, wherein a position, in the height direction, of a principal surface of the first piezoelectric substrate is different from a position, in the height direction, of a principal surface of the second piezoelectric substrate, the principal surface of the first piezoelectric substrate being one of the first principal surface and the second principal surface of the first piezoelectric substrate and being a principal surface on which the first IDT electrode is positioned, the principal surface of the second piezoelectric substrate being one of the first principal surface and the second principal surface of the second piezoelectric substrate and being a principal surface on which the second IDT electrode is positioned.

13. The elastic wave device according to claim 10, wherein the first IDT electrode is positioned on the second principal surface of the first piezoelectric substrate and the second IDT electrode is positioned on the second principal surface of the second piezoelectric substrate.

14. The elastic wave device according to claim 13, wherein a position, in the height direction, of a principal surface of the first piezoelectric substrate is different from a position, in the height direction, of a principal surface of the second piezoelectric substrate, the principal surface of the first piezoelectric substrate being one of the first principal surface and the second principal surface of the first piezoelectric substrate and being a principal surface on which the first IDT electrode is positioned, the principal surface of the second piezoelectric substrate being one of the first principal surface and the second principal surface of the second piezoelectric substrate and being a principal surface on which the second IDT electrode is positioned.

15. The elastic wave device according to claim 10, wherein the position, in the height direction, of the first principal surface of the first piezoelectric substrate is closer to the mount board than the position, in the height direction, of the first principal surface of the second piezoelectric substrate.

16. The elastic wave device according to claim 1, wherein the first bump is made of solder.

17. The elastic wave device according to claim 1, wherein the first bump includes a plurality of first bumps.

18. The elastic wave device according to claim 1, wherein the second bump is made of solder.

19. The elastic wave device according to claim 1, wherein the second bump includes a plurality of second bumps.

20. A radio-frequency front-end circuit comprising:
the elastic wave device according to claim 1; and
a power amplifier.

21. A communication device comprising:
the radio-frequency front-end circuit according to claim 20; and
an RF signal processing circuit.

* * * * *